United States Patent
Fukuda

(10) Patent No.: US 10,171,732 B2
(45) Date of Patent: Jan. 1, 2019

(54) IMAGE PROCESSING APPARATUS, IMAGE PICKUP APPARATUS, IMAGE PROCESSING METHOD, AND NON-TRANSITORY COMPUTER-READABLE STORAGE MEDIUM FOR GENERATING AN IMAGE BASED ON PLURALITY OF PARALLAX IMAGES

(71) Applicant: CANON KABUSHIKI KAISHA, Tokyo (JP)

(72) Inventor: Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/539,318

(22) PCT Filed: Feb. 10, 2016

(86) PCT No.: PCT/JP2016/000700
§ 371 (c)(1),
(2) Date: Jun. 23, 2017

(87) PCT Pub. No.: WO2016/139895
PCT Pub. Date: Sep. 9, 2016

(65) Prior Publication Data
US 2018/0013951 A1   Jan. 11, 2018

(30) Foreign Application Priority Data
Mar. 3, 2015  (JP) .................................. 2015-041326

(51) Int. Cl.
*H04N 5/232* (2006.01)
*G02B 7/34* (2006.01)
(Continued)

(52) U.S. Cl.
CPC .......... *H04N 5/23232* (2013.01); *G02B 7/34* (2013.01); *H04N 5/225* (2013.01);
(Continued)

(58) Field of Classification Search
CPC .......... H04N 5/23232; H04N 5/23212; H04N 5/3696
See application file for complete search history.

(56) References Cited

U.S. PATENT DOCUMENTS 4,410,804 A   10/1983   Stauffer
8,773,549 B2   7/2014   Fukuda
(Continued)

FOREIGN PATENT DOCUMENTS

CN   102595170 A   7/2012
CN   103002218 A   3/2013
(Continued)

OTHER PUBLICATIONS

International Preliminary Report on Patentability and Written Opinion dated Sep. 14, 2017, in International Patent Appln. No. PCT/JP2016/000700.
(Continued)

*Primary Examiner* — Nelson D. Hernández Hernández
(74) *Attorney, Agent, or Firm* — Venable LLP

(57) ABSTRACT

An image processing apparatus includes at least one processor operatively coupled to a memory. The at least one processor functions as a determiner configured to determine a weight coefficient that varies depending on a position in each of a plurality of parallax images, and an image generator configured to synthesize the plurality of parallax images based on the weight coefficient to generate an image. In addition, a sum of the weight coefficients of the plurality of parallax images is constant with respect to all positions in the plurality of parallax images.

18 Claims, 9 Drawing Sheets

(51) Int. Cl.
*H04N 5/369* (2011.01)
*H04N 5/225* (2006.01)

(52) U.S. Cl.
CPC ..... *H04N 5/23209* (2013.01); *H04N 5/23212* (2013.01); *H04N 5/23229* (2013.01); *H04N 5/3696* (2013.01)

(56) References Cited

U.S. PATENT DOCUMENTS

| | | |
|---|---|---|
| 9,344,624 B2 | 5/2016 | Fukuda et al. |
| 9,426,349 B2 | 8/2016 | Fukuda |
| 9,609,208 B2 | 3/2017 | Fukuda et al. |
| 2012/0176506 A1* | 7/2012 | Tajiri .................... H04N 5/2254 348/222.1 |
| 2013/0063571 A1 | 3/2013 | Ishii |
| 2017/0154408 A1 | 6/2017 | Jobara et al. |

FOREIGN PATENT DOCUMENTS

| | | |
|---|---|---|
| EP | 2 475 162 A2 | 7/2012 |
| JP | 2001-083407 A | 3/2001 |
| JP | 2012-147046 A | 8/2012 |
| JP | 2013-061743 A | 4/2013 |
| WO | 2013/105383 A1 | 7/2013 |

OTHER PUBLICATIONS

International Search Report and Written Opinion of Parent International Application No. PCT/JP2016/000700 dated Apr. 19, 2016.
Copending, unpublished U.S. Appl. No. 15/545,050, filed Jul. 20, 2017, to Koichi Fukuda.
Extended European Search Report dated Sep. 4, 2018, issued in European Patent Application No. 16758596.7.
Office Action dated Nov. 6, 2018, issued in Japanese Patent Application No. 2015-041326.

* cited by examiner

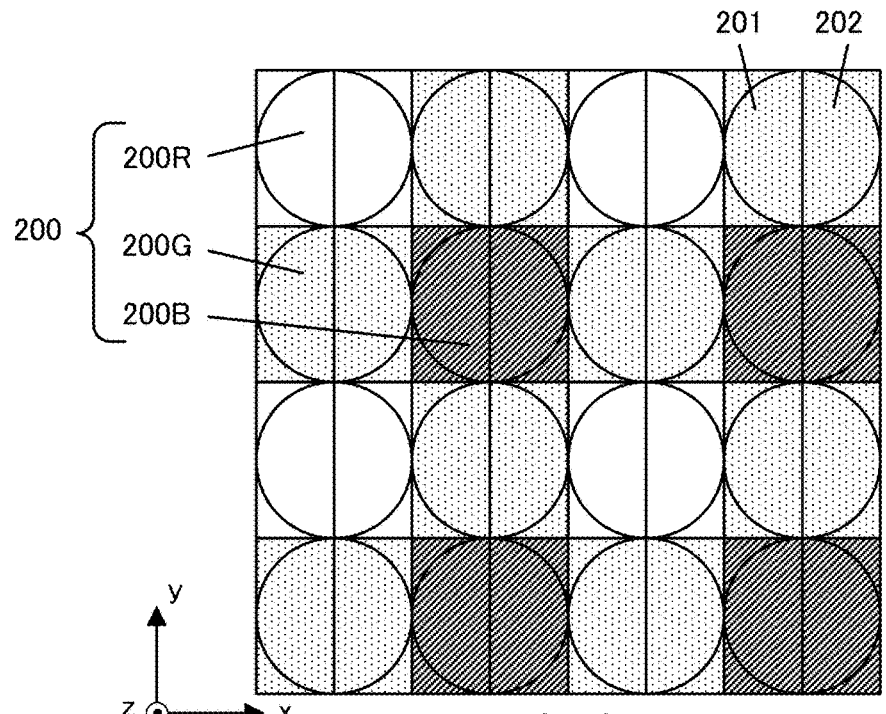
FIG. 2
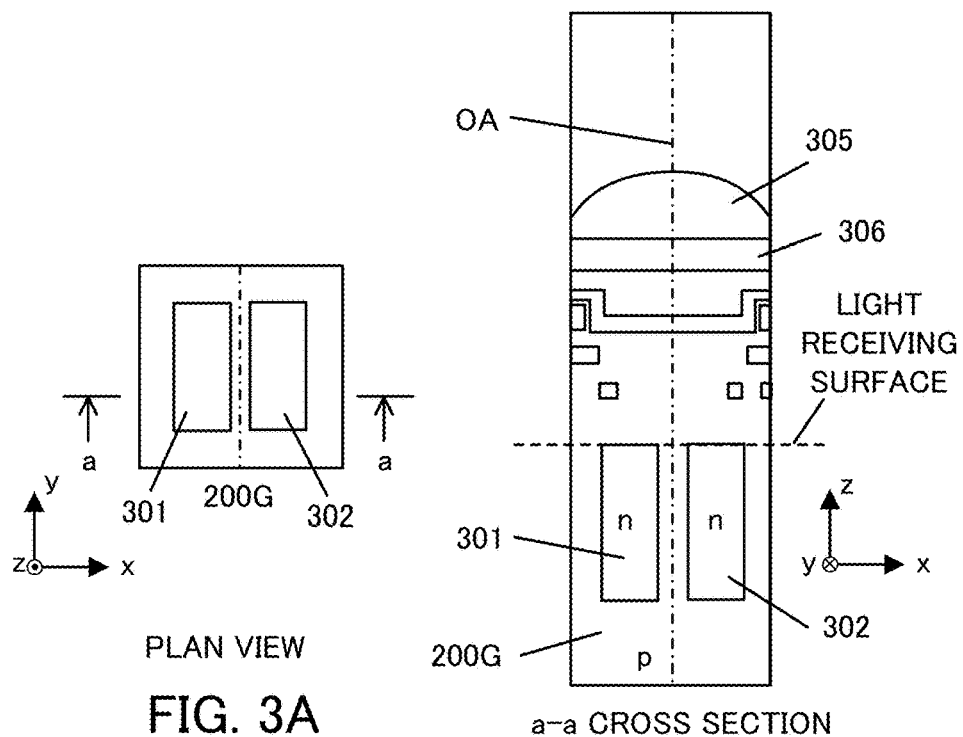
PLAN VIEW
FIG. 3A
a-a CROSS SECTION
FIG. 3B

PLAN VIEW a-a CROSS SECTION

IMAGE PROCESSING APPARATUS, IMAGE PICKUP APPARATUS, IMAGE PROCESSING METHOD, AND NON-TRANSITORY COMPUTER-READABLE STORAGE MEDIUM FOR GENERATING AN IMAGE BASED ON PLURALITY OF PARALLAX IMAGES

TECHNICAL FIELD

The present invention relates to an image processing apparatus that synthesizes a plurality of parallax images to output an image.

BACKGROUND ART

Previously, an image pickup apparatus that is capable of dividing an exit pupil of an imaging lens into a plurality of pupil regions and capturing a plurality of parallax images simultaneously according to the divided pupil regions has been known.

U.S. Pat. No. 4,410,804 discloses an image pickup apparatus that uses a two-dimensional image pickup element including a single microlens and divided photoelectric converters. The divided photoelectric converters receive light beams passing through respective partial pupil regions in an exit pupil of the imaging lens via the single microlens to divide the pupils. A plurality of parallax images depending on the divided partial pupil regions can be generated based on light receiving signals of the respective divided photoelectric converters. Japanese Patent Laid-Open No. 2001-083407 discloses an image pickup apparatus which adds all of light receiving signals of divided photoelectric converters to generate a captured image.

SUMMARY OF THE INVENTION

Technical Problem

In the image pickup apparatus disclosed in each of U.S. Pat. No. 4,410,804 and Japanese Patent Laid-Open No. 2001-083407, a main object may be photographed to focus on the main object to be effectively emphasized while a foreground or a background is greatly blurred. Depending on a photographing scene, however, a blur covering in which the main object is concealed by the large blur of the foreground (for example, petals) located in front of the main object (for example, a bird) occurs, and thus, a quality of a captured image may be deteriorated.

The present invention provides an image processing apparatus, an image pickup apparatus, an image processing method, a program, and a storage medium that improve a quality of a captured image.

Solution to Problem

An image processing apparatus as one aspect of the present invention includes a determiner configured to determine a weight coefficient that varies depending on a position in each of a plurality of parallax images, and an image generator configured to synthesize the plurality of parallax images based on the weight coefficient to generate an image.

An image pickup apparatus as another aspect of the present invention includes an image pickup element including a plurality of pixels, each pixel including a plurality of photoelectric converters configured to receive light beams passing through partial pupil regions of an imaging optical system different from each other, a determiner configured to determine a weight coefficient that varies depending on a position in each of a plurality of parallax images obtained from the plurality of photoelectric converters, and an image generator configured to synthesize the plurality of parallax images based on the weight coefficient to generate an image.

An image processing method as another aspect of the present invention includes the steps of determining a weight coefficient that varies depending on a position in each of a plurality of parallax images, and synthesizing the plurality of parallax images based on the weight coefficient to generate an image.

A non-transitory computer-readable storage medium as another aspect of the present invention stores a program that causes a computer to execute the image processing method.

Further features and aspects of the present invention will become apparent from the following description of exemplary embodiments with reference to the attached drawings.

Advantageous Effects of Invention

According to the present invention, an image processing apparatus, an image pickup apparatus, an image processing method, a program, and a storage medium that improve a quality of a captured image can be provided.

BRIEF DESCRIPTION OF DRAWINGS

FIG. 2 is a diagram of illustrating a pixel array in Embodiment 1.

FIG. 3A is a diagram of illustrating a pixel structure in Embodiment 1.

FIG. 3B is a diagram of illustrating the pixel structure in Embodiment 1.

DESCRIPTION OF EMBODIMENTS

Exemplary embodiments of the present invention will be described below with reference to the accompanied drawings.

Embodiment 1

Figure 1:
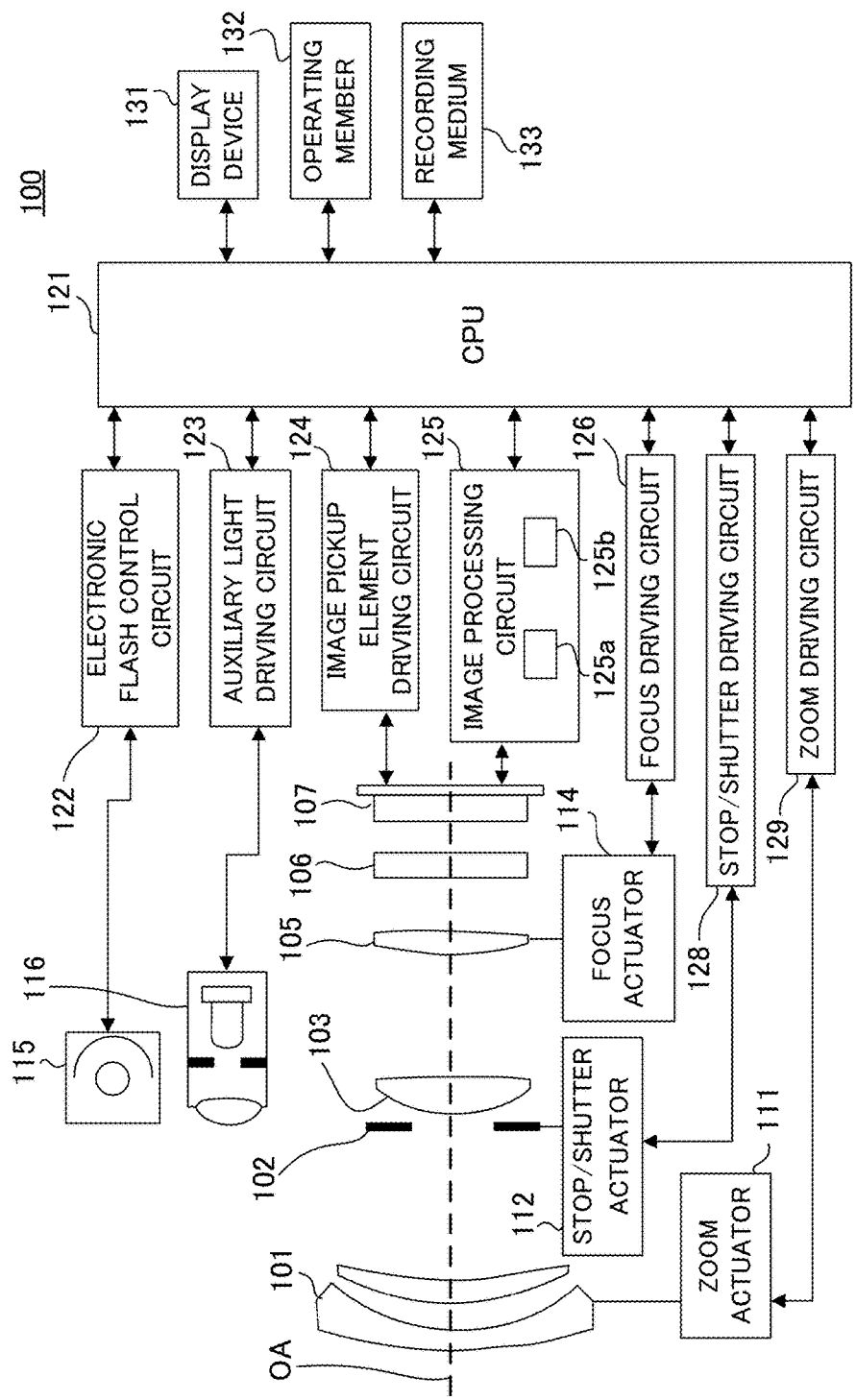
FIG. 1 is a block diagram of an image pickup apparatus in each embodiment.

First of all, referring to FIG. 1, a schematic configuration of an image pickup apparatus in Embodiment 1 of the present invention will be described. FIG. 1 is a block diagram of an image pickup apparatus 100 (camera) in this embodiment. The image pickup apparatus 100 is a digital camera system that includes a camera body and an interchangeable lens (imaging optical system or image pickup optical system) removably attached to the camera body. This embodiment, however, is not limited to this configuration, and can be applied also to an image pickup apparatus in which a camera body and a lens are integrated with each other.

A first lens unit 101 is disposed at the forefront side (object side) of a plurality of lens units that constitute an imaging lens (imaging optical system), and is held on a lens barrel so as to be movable back and forth in a direction of an optical axis OA (optical axis direction). A stop/shutter 102 (aperture stop) adjusts an opening diameter to control a light intensity when capturing an image, and also functions as a shutter to control an exposure time when capturing a still image. A second lens unit 103 moves integrally with the stop/shutter 102 back and forth in the optical axis direction, and has a zoom function that performs a magnification-varying operation in conjunction with the back-and-forth motion of the first lens unit 101. A third lens unit 105 is a focus lens unit that moves back and forth in the optical axis direction to perform focusing (focus operation). An optical low-pass filter 106 is an optical element that reduces a false color or a moire of a captured image.

An image pickup element 107 performs a photoelectric conversion of an object image (optical image) formed via the imaging optical system, and, for example, includes a CMOS sensor or a CCD sensor, and a peripheral circuit. As the image pickup element 107, for example, a two-dimensional single plate color sensor is used that includes a primary color mosaic filter having a Bayer array formed on a light receiving pixel having m pixels in a horizontal direction and having n pixels in a vertical direction in an on-chip configuration.

A zoom actuator 111 rotationally moves (drives) a cam cylinder (not illustrated) to move the first lens unit 101 and the second lens unit 103 along the optical axis direction to perform the magnification-varying operation. A stop/shutter actuator 112 controls the opening diameter of the stop/shutter 102 to adjust the light intensity (photographing light intensity) and also controls the exposure time in capturing the still image. A focus actuator 114 moves the third lens unit 105 in the optical axis direction to perform the focusing.

An electronic flash 115 is an illumination device to be used for illuminating the object. As the electronic flash 115, a flash illumination device that includes a xenon tube or an illumination device that includes an LED (light emitting diode) continuously emitting light is used. An AF auxiliary lighting unit 116 projects an image of a mask having a predetermined opening pattern onto the object via a projection lens. In this configuration, a focus detection capability for a dark object or an object with a low contrast can be improved.

The CPU 121 is a control apparatus (controller) that governs various controls of the image pickup apparatus 100. The CPU 121 includes a processor, a ROM, a RAM, an A/D converter, a D/A converter, a communication interface circuit, and the like. The CPU 121 reads out and executes a predetermined program stored in the ROM to drive various circuits of the image pickup apparatus 100 and to perform a series of operations such as focus detection (AF), image capturing (photographing), image processing, or recording.

An electronic flash control circuit 122 performs a lighting control of the electronic flash 115 in synchronization with the image capturing operation. An auxiliary light driving circuit 123 performs a lighting control of the AF auxiliary lighting unit 116 in synchronization with the focus detection operation. An image pickup element driving circuit 124 controls the image capturing operation of the image pickup element 107 and also performs the A/D conversion of the acquired image signal to send it to the CPU 121.

An image processing circuit 125 (image processing apparatus) performs processings, such as a γ (gamma) conversion, a color interpolation, or a JPEG (Joint Photographic Experts Group) compression on the image data output from the image pickup element 107. In this embodiment, the image processing circuit 125 includes a determiner 125a and an image generator 125b. The determiner 125a determines a weight coefficient that varies depending on a position in each of a plurality of parallax images. The image generator 125b synthesizes (combines) the plurality of parallax images based on the weight coefficient to generate an image.

A focus driving circuit 126 (focus driver) drives the focus actuator 114 based on the focus detection result to move the third lens unit 105 along the optical axis direction to perform the focusing. A stop/shutter driving circuit 128 drives the stop/shutter actuator 112 to control the opening diameter of the stop/shutter 102. A zoom driving circuit 129 (zoom driver) drives the zoom actuator 111 in response to a zoom operation by a user.

A display device 131 (display unit) includes, for example, an LCD (liquid crystal display). The display device 131 displays information relating to an image capturing mode of the image pickup apparatus 100, a preview image before capturing an image, a confirmation image after capturing the image, an in-focus state displaying image in the focus detection, or the like. An operating member 132 (operating switch unit) includes a power switch, a release (image capturing trigger) switch, a zoom operation switch, an image capturing mode selection switch, and the like. The release switch is a two-step switch in a half-depression state (in a state where SW1 is ON) and in a full-depression state (in a state where SW2 is ON). A recording medium 133 is, for example, a flash memory that is removable from the image pickup apparatus 100, and records the captured image (image data).

Subsequently, referring to FIGS. 2, 3A, and 3B, a pixel array and a pixel structure of the image pickup element 107 in this embodiment will be described. FIG. 2 is a diagram illustrating the pixel array of the image pickup element 107. FIGS. 3A and 3B are diagrams illustrating the pixel structure of the image pickup element 107, and FIGS. 3A and 3B illustrate a plan view of a pixel 200G of the image pickup element 107 (viewed in a +z direction) and a cross-sectional view along a line a-a in FIG. 3A (viewed in a −z direction), respectively.

FIG. 2 illustrates the pixel array (array of imaging pixels) of the image pickup element 107 (two-dimensional CMOS sensor) in a range of 4 columns×4 rows. In this embodiment, each of the imaging pixels (pixels 200R, 200G, and 200B) includes two subpixels 201 and 202. Therefore, FIG. 2 illustrates the array of the subpixels 201, 202 in a range of 8 columns×4 rows.

As illustrated in FIG. 2, a pixel group 200 of 2 columns×2 rows includes the pixels 200R, 200G, and 200B in a Bayer array. In other words, in the pixel group 200, the pixel 200R having a spectral sensitivity for R (red) is disposed at the upper left, the pixels 200G having a spectral sensitivity for G (green) are disposed at the upper right and at the lower left, and the pixel 200B having a spectral sensitivity for B (blue) is disposed at the lower right. Each of the pixels 200R, 200G, and 200B (each imaging pixel) includes the subpixels 201 and 202 arrayed in 2 columns×1 row. The subpixel 201 is a pixel that receives a light beam passing through a first pupil region of the imaging optical system. The subpixel 202 is a pixel that receives a light beam passing through a second pupil region of the imaging optical system.

As illustrated in FIG. 2, the image pickup element 107 includes a number of imaging pixels of 4 columns×4 rows (subpixels of 8 columns×4 rows) arranged on a surface, and outputs an imaging signal (subpixel signal). In the image pickup element 107 of this embodiment, a period P of the pixels 200R, 200G, and 200B (imaging pixels) is 4 μm, and the number N of the pixels 200R, 200G, and 200B (imaging pixels) is horizontally 5575 columns×vertically 3725 rows=approximately 20.75 million pixels. In the image pickup element 107, a period $P_{SUB}$ of the subpixels 200, 201 in a column direction is 2 μm, and the number $N_{SUB}$ of the subpixels 200, 201 is horizontally 11150 columns×vertically 3725 rows=approximately 41.50 million pixels.

As illustrated in FIG. 3B, the pixel 200G of this embodiment is provided with a microlens 305 at a light receiving surface side of the pixel 200G to condense incident light. A plurality of microlenses 305 are arrayed in two dimensions, and each of the microlenses 305 is disposed at a position away from a light receiving surface by a predetermined distance in a z-axis direction (direction of an optical axis direction). In the pixel 200G, a photoelectric converter 301 and a photoelectric converter 302 are formed by dividing the pixel into $N_H$ (two divisions) in an x-axis direction and into $N_V$ (one division) in a y-axis direction. The photoelectric converter 301 and the photoelectric converter 302 correspond to the subpixel 201 and the subpixel 202, respectively.

Each of the photoelectric converters 301 and 302 is configured as a photodiode having a p-i-n structure that includes a p-type layer, an n-type layer, and an intrinsic layer in between the p-type layer and the n-type layer. If necessary, the intrinsic layer can be excluded and a photodiode with a p-n junction may be applicable. The pixel 200G (each pixel) is provided with a color filter 306 between the microlens 305 and each of the photoelectric converters 301 and 302. If necessary, a spectral transmittance of the color filter 306 can be changed for each subpixel 201, 202, or, alternatively, the color filter 306 may be excluded.

As illustrated in FIGS. 3A and 3B, the light entering the pixel 200G is condensed by the microlens 305 and is dispersed by the color filter 306, and then, the dispersed lights are received by the photoelectric converters 301 and 302. In each of the photoelectric converters 301 and 302, pairs of an electron and a hole are generated depending on a light receiving amount, and they are separated in a depletion layer, and then the electrons with a negative charge are accumulated in the n-type layer. On the other hand, the holes are excluded to the outside of the image pickup element 107 through the p-type layer connected to a constant voltage source (not illustrated). The electrons accumulated in the n-type layers of the photoelectric converters 301 and 302 are transferred to an electrostatic capacitance (FD) through a transfer gate to be converted to a voltage signal.

Figure 4:
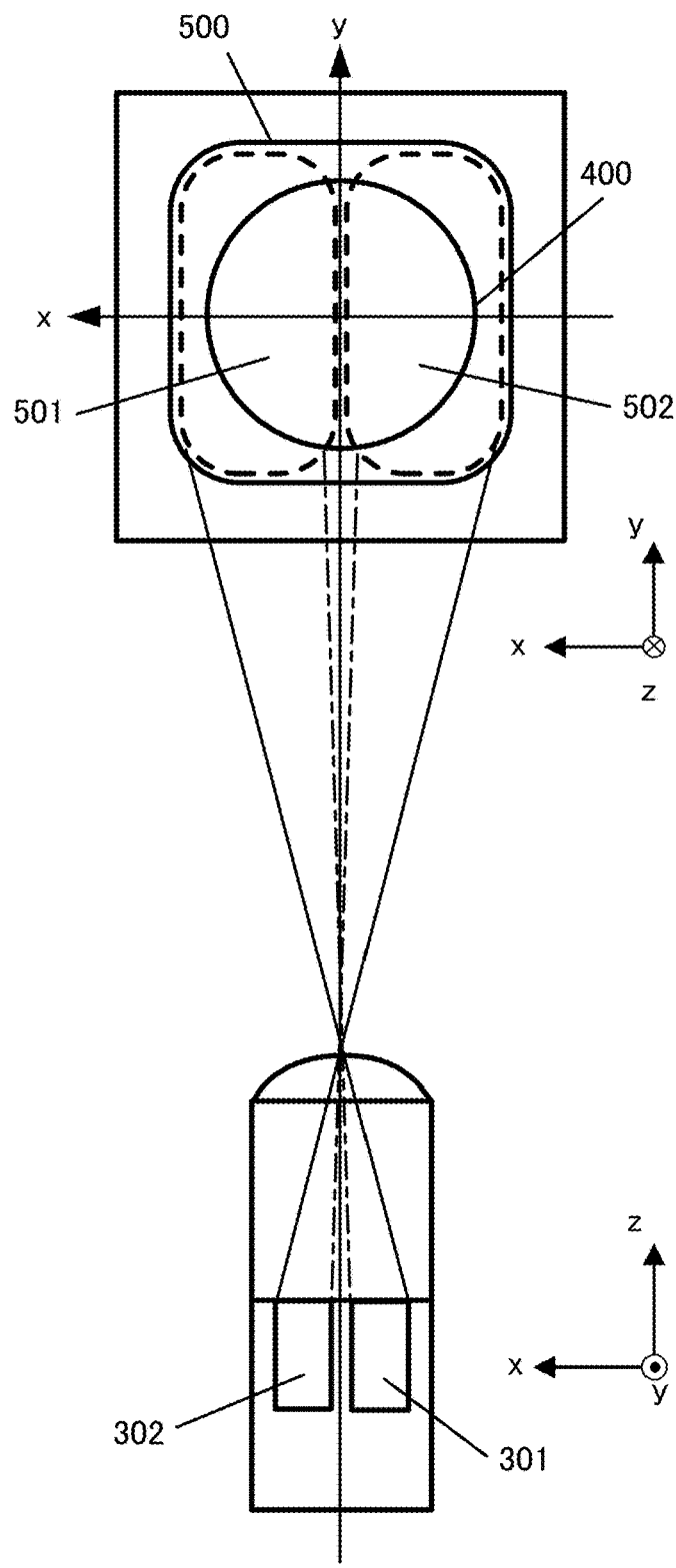
FIG. 4 is an explanatory diagram of an image pickup element and a pupil dividing function in each embodiment.

Subsequently, referring to FIG. 4, a pupil dividing function of the image pickup element 107 will be described. FIG. 4 is an explanatory diagram of the pupil dividing function of the image pickup element 107, and illustrates a situation of the pupil division in one pixel portion. FIG. 4 illustrates a cross-sectional view of the section a-a of the pixel structure illustrated in FIG. 3A when seen in the +y direction and an exit pupil plane of the imaging optical system. In FIG. 4, in order to correspond to a coordinate axis of the exit pupil plane, the x-axis and y-axis in the cross-sectional view are inverted with respect to the x-axis and y-axis of FIGS. 3A and 3B.

In FIG. 4, a partial pupil region 501 (first partial pupil region) for the subpixel 201 (first subpixel) has approximately a conjugate relation, via the microlens 305, with respect to the light receiving surface of the photoelectric converter 301 whose center of gravity is displaced (decentered) in the −x direction. Thus, the partial pupil region 501 represents a pupil region that is capable of receiving light by the subpixel 201. The center of gravity of the partial pupil region 501 for the subpixel 201 is displaced (decentered) in the +x direction on a pupil plane. A partial pupil region 502 (second partial pupil region) for the subpixel 202 (second subpixel) has approximately a conjugate relation, via the microlens 305, with respect to the light receiving surface of the photoelectric converter 302 whose center of gravity is displaced (decentered) in the +x direction. Thus, the partial pupil region 502 represents a pupil region that is capable of receiving light by the subpixel 202. The center of gravity of the partial pupil region 502 for the subpixel 202 is displaced (decentered) in the −x direction on the pupil plane. A pupil region 500 is a pupil region that is capable of receiving light over the entire region of the pixel 200G when the photoelectric converters 301 and 302 (subpixels 201 and 202) are entirely combined.

The incident light is condensed at a focal position by the microlens 305. Due to an influence of diffraction caused by wave nature of light, however, a diameter of a condensed spot cannot be smaller than a diffraction limit Δ and it has a finite size. While a size of the light receiving surface of each of the photoelectric converters 301 and 302 is around 1 to 2 μm, the condensed spot of the microlens 305 is around 1 μm. Accordingly, the partial pupil regions 501 and 502 in FIG. 4, each having a conjugate relation to the light receiving surfaces of the photoelectric converters 301 and 302, respectively, via the microlens 305, are not clearly divided due to a diffraction blur, and thus, a light receiving rate distribution (pupil intensity distribution) is obtained.

Figure 5:
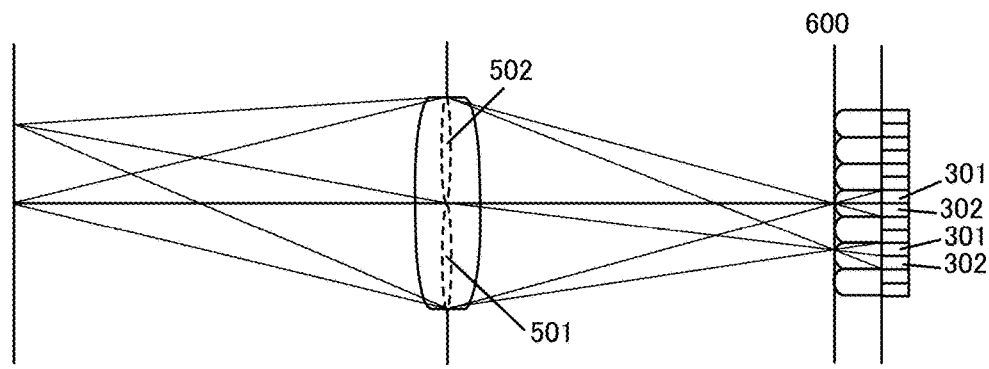
FIG. 5 is an explanatory diagram of the image pickup element and the pupil dividing function in each embodiment.

FIG. 5 is a diagram of explaining the image pickup element 107 and the pupil dividing function. The light beams passing through the partial pupil regions 501 and 502 different from each other in the pupil region of the imaging optical system enter each pixel of the image pickup element 107, i.e. an imaging plane 600 of the image pickup element 107, at angles different from each other, and are received by the subpixels 201 and 202 divided into 2×1. This embodiment describes an example in which the pupil region is divided into two pupil regions in a horizontal direction, but is not limited to this configuration, and the pupil division may be performed in a vertical direction if necessary.

In this embodiment, the image pickup element 107 includes the plurality of subpixels 201, 202 that share a single microlens 305 and that receive a plurality of light beams passing through regions (the first partial pupil region 501 and the second partial pupil region 502) different from each other in a pupil of the imaging optical system (imaging lens). The image pickup element 107 includes, as the plurality of subpixels, first subpixels 201 (a plurality of subpixels 201) and second subpixels 202 (a plurality of subpixels 202). In this embodiment, a first parallax image is generated by collecting the light receiving signals of the plurality of subpixels 201, and a second parallax image is generated by collecting the light receiving signals of the plurality of subpixels 202. As described above, in this embodiment, each of the parallax images is generated by collecting the light receiving signals of the plurality of subpixels 201, 202 for each of the partial pupil regions 501, 502 that are different from each other.

In this embodiment, each of the first parallax image and the second parallax image is an image in the Bayer array. If necessary, demosaicing processing may be performed on each of the first parallax image and the second parallax image. In this embodiment, signals of the subpixels 201 and 202 are added (combined) for each pixel 200R, 200G, and 200B of the image pickup element 107 so that a captured image with a resolution of the number N of effective pixels can be generated. As described above, in this embodiment, the captured image is generated based on the plurality of parallax images (the first and second parallax images).

Figure 6:
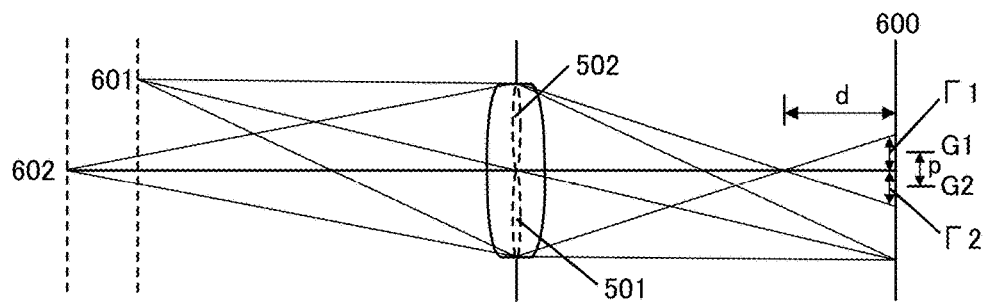
FIG. 6 is a diagram of a relationship between a defocus amount and an image shift amount in each embodiment.

Next, referring to FIG. 6, the relation between a defocus amount of the first parallax image acquired from the subpixels 201 of the image pickup element 107 and the second parallax images acquired from the subpixels 202 of the image pickup element 107, and an image shift amount will be described. FIG. 6 is a diagram illustrating the relation between the defocus amount and the image shift amount. In FIG. 6, the image pickup element 107 is disposed on the imaging plane 600, and similarly to FIGS. 4 and 5, a situation in which the exit pupil of the imaging optical system is divided into two partial pupil regions 501 and 502 is illustrated.

A defocus amount d is defined such that a distance from an imaging position of an object to the imaging plane 600 is |d|, a front focus state in which the imaging position is located at an object side relative to the imaging plane 600 is a negative sign (d<0), and a rear focus state in which the imaging position is located at a side opposite to the object relative to the imaging plane 600 is a positive sign (d>0). In an in-focus state in which the imaging position of the object is on the imaging plane 600 (in-focus position), the defocus amount d=0 is satisfied. In FIG. 6, an object 601 that is in the in-focus state (d=0) and an object 602 that is in the front focus state (d<0) are illustrated. The front focus state (d<0) and the rear focus state (d>0) are collectively referred to as a defocus state (|d|>0).

In the front focus state (d<0), the light beam that has passed through the partial pupil region 501 (or partial pupil region 502) of light beams from the object 602 is condensed once. Then, the light beam spreads to a width Γ1 (Γ2) around a center position of gravity G1 (G2) of the light beam, and a blurred image is formed on the imaging plane 600. The blurred image is received by the subpixels 201 (subpixels 202) constituting each pixel 200R, 200G, 200B arrayed in the image pickup element 107, and the first parallax image (second parallax image) is generated. Therefore, the first parallax image (second parallax image) is recorded as a blurred object image in which the object 602 is blurred to have the width Γ1 (Γ2) at the center position of gravity G1 (G2) on the imaging plane 600. The blurred width Γ1 (Γ2) of the object image roughly increases in proportion as the absolute value |d| of the defocus amount d increases. Similarly, an absolute value |p| of an image shift amount p of the object image between the first and second parallax images (i.e. an amount that is equivalent to a difference of the center positions of gravity of the light beams (G1−G2)) roughly increases as the absolute value |d| of the defocus amount d increases. This is similarly applied to the rear focus state (d>0), but an image shift direction of the object image between the first and second parallax images is opposite to that in the front focus state.

As described above, in this embodiment, the absolute value of the image shift amount p between the first and second parallax images increases with increasing the absolute value of the defocus amount d of the first and second parallax images or the imaging signals obtained by adding the first and second parallax images.

Next, image processing for blur adjustment (for reducing a blur covering of a main object) in this embodiment will be described. The image processing for the blur adjustment (for reducing the blur covering of the main object) is performed by the image processing circuit 125 (the determiner 125a and the image generator 125b) based on an instruction of the CPU 121. The image processing circuit 125 inputs a plurality of parallax images (first and second parallax images) acquired by the image pickup element 107 to perform the image processing in this embodiment.

Figure 7:
FIG. 7 is an example of a blur covering image of a main object.

FIG. 7 illustrates an image in which the blur covering in which a foreground (petals) as a second object located in front of, i.e., in a closer range than, a main object (bird) as a first object is greatly blurred to conceal the main object occurs in a region 700 of FIG. 7.

In this embodiment, each of symbols j and i is an integer, a j-th position in a row direction and a i-th position in a column direction of a first parallax image (and a second parallax image) is represented as (j,i), and the first parallax image and the second parallax image at the position (j,i) are represented as A(j,i) and B(j,i), respectively.

As a first step, the CPU 121 (image processing circuit 125) sets a predetermined region R=[j1,j2]×[i1,i2] for reducing the blur covering of the main object, and a boundary width σ of the predetermined region R. Then, the CPU 121 calculates a table function T(j,i) depending on the predetermined region R and the boundary width σ of the predetermined region R according to expression (1) below.

Math. 1

$$T(j, i) = 0.5 * \left[\tan\frac{(j-j_1)}{\sigma} - \tan\frac{(j-j_2)}{\sigma}\right] \times 0.5 * \left[\tan\frac{(i-i_1)}{\sigma} - \tan\frac{(i-i_2)}{\sigma}\right] \quad (1)$$

The table function T(j,i) indicates 1 inside the predetermined range R and indicates 0 outside the predetermined range R, and roughly changes continuously from 1 to 0 in the boundary width σ of the predetermined region R. If necessary, the predetermined region R may be a circular shape or another arbitrary shape. Furthermore, if necessary, a plurality of predetermined regions R and boundary widths σ may be set.

As a second step, the CPU 121 (image processing circuit 125) calculates a first weight coefficient $W_a(j,i)$ of the first parallax image A(j,i) by using a real coefficient w (−1≤w≤1)

according to expression (2A) below. Similarly, the CPU 121 (image processing circuit 125) calculates a second weight coefficient $W_b(j,i)$ of the second parallax image according to expression (2B) below.

Math. 2A $$W_a(j,i)=1-wT(j,i) \quad (2A)$$

Math. 2B $$W_b(j,i)=1+wT(j,i) \quad (2B)$$

As a third step, the image processing circuit 125 generates an output image $I(j,i)$ by using the first parallax image $A(j,i)$, the second parallax image $B(j,i)$, the first weight coefficient $W_a(j,i)$, and the second weight coefficient $W_b(j,i)$ according to expression (3) below.

Math. 3

$$I(j,i)=W_a(j,i)*A(j,i)+W_b(j,i)*B(j,i) \quad (3)$$

If necessary, the image processing circuit 125 may combine the refocus processing by a shift amount s to generate an output image $I(j,i)$ according to expressions (4A) and (4B) below.

Math. 4A $$I_s(j,i)=W_a(j,i)*A(j,i)+W_b(j,i)*B(j,i+s) \quad (4A)$$

Math. 4B $$I_s(j,i)=W_a(j,i)*A(j,i)+W_b(j,i+s)*B(j,i+s) \quad (4B)$$

Figure 13:
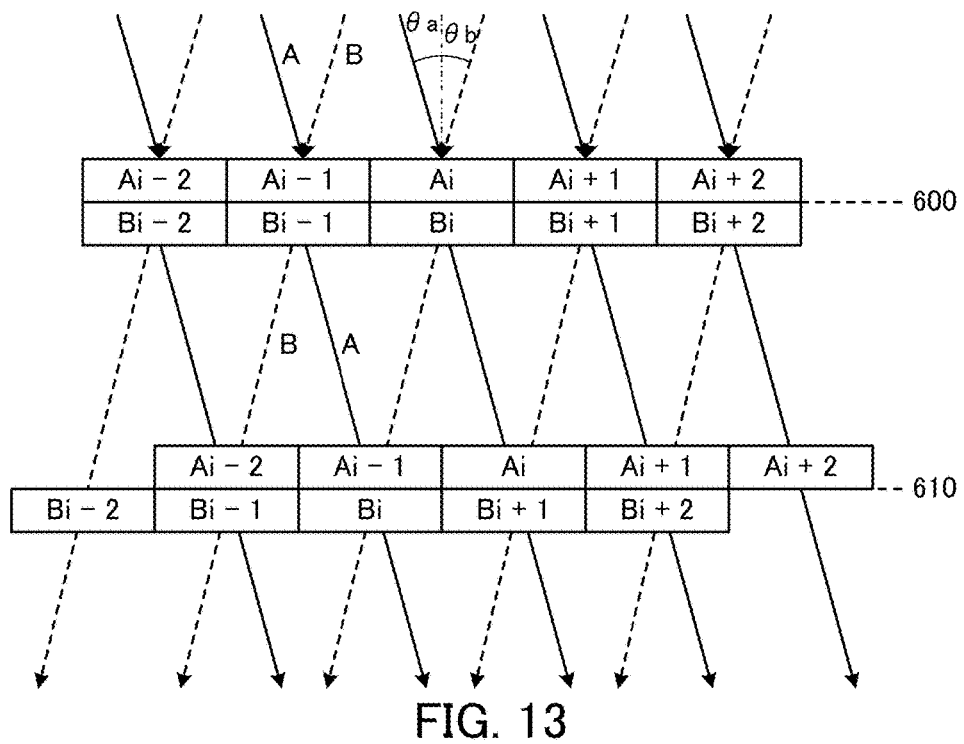
FIG. 13 is a schematic explanatory diagram of refocus processing in each embodiment.

Referring to FIG. 13, the refocus processing will be described. FIG. 13 is an explanatory diagram of the refocus processing in a one-dimensional direction (column direction, or horizontal direction) by a first signal (light receiving signal of the first subpixel 201) and a second signal (light receiving signal of the second subpixel 202) acquired by the image pickup element 107 of this embodiment. In FIG. 13, symbol i denotes an integer, and, schematically, symbols Ai and Bi denote the first signal and the second signal, respectively, of an i-th pixel in the column direction of the image pickup element 107 disposed on the imaging plane 600. The first signal Ai is a light receiving signal output based on the light beam entering the i-th pixel at a principal ray angle θa (corresponding to the partial pupil region 501 in FIG. 5). The second signal Bi is a light receiving signal output based on the light beam entering the i-th pixel at a principal ray angle θb (corresponding to the partial pupil region 502 in FIG. 5).

Each of the first signal Ai and the second signal Bi has incident angle information as well as light intensity distribution information. Therefore, the first signal Ai is moved parallel (translated) to a virtual imaging plane 610 at the angle θa, and the second signal Bi is moved parallel (translated) to the virtual imaging plane 610 at the angle θb, and then these signals are added to be able to generate the refocus signal on the virtual imaging plane 610. The parallel movement of the first signal Ai to the virtual imaging plane 610 at the angle θa corresponds to a shift by +0.5 pixel in the column direction, and the parallel movement of the second signal Bi to the virtual imaging plane 610 at the angle θb corresponds to a shift by −0.5 pixel in the column direction. Accordingly, when the first signal Ai and the second signal Bi are relatively shifted by +1 pixel to add the first signal Ai to the corresponding second signal (Bi+1), i.e., to combine the first signal Ai with the second signal (Bi+1), the refocus signal on the virtual imaging plane 610 can be generated. Similarly, when the first signal Ai and the second signal Bi are shifted by an integral multiple of the pixel pitch (i.e. integer shift is performed) and these signals are added, the shift addition signal (refocus signal) on each virtual imaging plane 610 can be generated according to the integer shift amount.

In this embodiment, a plurality of parallax images $A(j,i)$ and $B(j,i)$, which are acquired by an image pickup element 107 including a plurality of pixels 200R, 200G, and 200B, each pixel including a plurality of subpixels 201, 202 that receives light beams passing through partial pupil regions 501, 502 of an imaging optical system different from each other, are input, and each of the parallax images $A(j,i)$ and $B(j,i)$ is multiplied by a weight coefficient $W_a(j,i)$, $W_b(j,i)$ to synthesize the weighted parallax images to generate an output image $I(j,i)$. Preferably, in this embodiment, the weight coefficient $W_a(j,i)$, $W_b(j,i)$ for each of the plurality of parallax images $A(j,i)$ and $B(j,i)$ changes continuously depending on a region in the output image $I(j,i)$. Preferably, in this embodiment, the output image $I(j,i)$ is generated by adding or by shifting and adding the parallax images $A(j,i)$ and $B(j,i)$ while each of the parallax images $A(j,i)$ and $B(j,i)$ is multiplied by the weight coefficient $W_a(j,i)$, $W_b(j,i)$.

Figure 8A:
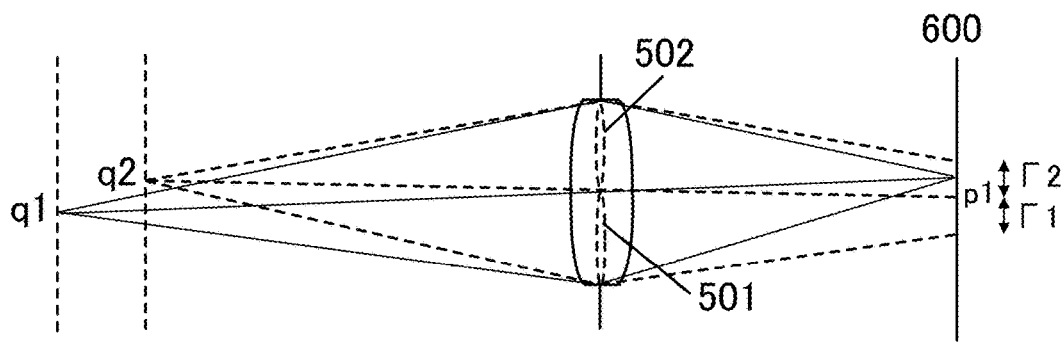
FIG. 8A is an explanatory diagram of image processing (blur adjustment processing) in each embodiment.
Figure 8B:
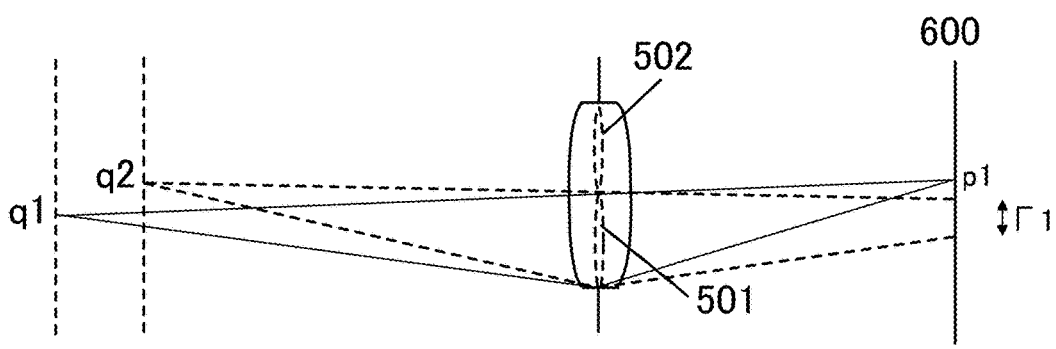
FIG. 8B is an explanatory diagram of the image processing (blur adjustment processing) in each embodiment.
Figure 8C:
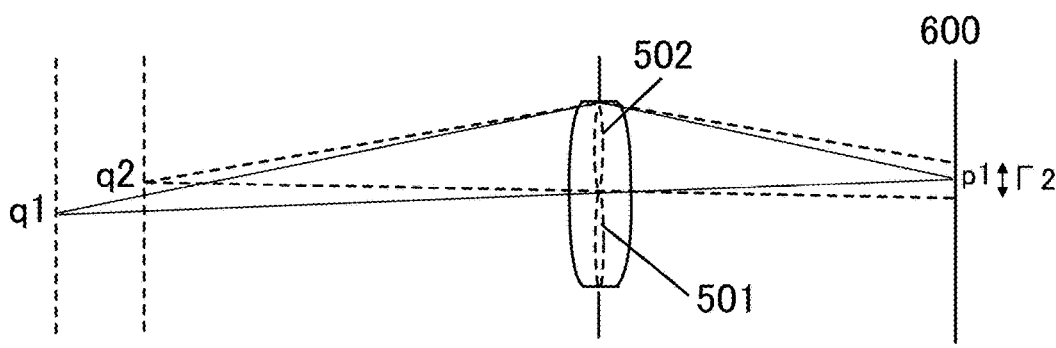
FIG. 8C is an explanatory diagram of the image processing (blur adjustment processing) in each embodiment.

Next, referring to FIGS. 8A to 8C, a principle of image processing of the blur adjustment that reduces the blur covering of a main object will be described. FIGS. 8A to 8C are explanatory diagrams of the image processing for the blur adjustment. In FIGS. 8A to 8C, the image pickup element 107 of this embodiment is disposed on the imaging plane 600, and, similarly to FIG. 5, the exit pupil of the imaging optical system is divided into two of the partial pupil regions 501 and 502.

FIG. 8A is an example of a blur covering image of a main object, and illustrates a state in which a blurred image (Γ1+Γ2) of an object q2 (second object) is photographed to overlap with an image p1 (in-focus image) of a main object q1 (first object) behind the object q2. FIGS. 8B and 8C, with respect to the example of FIG. 8A, illustrate diagrams in which the light beams passing through the partial pupil regions 501 and 502 of the imaging optical system are separated from each other.

In FIG. 8B, the light beam from the main object q1 passes through the partial pupil region 501 and is imaged as the image p1 in an in-focus state, and the light beam from the object q2 in front of the main object q1 passes through the partial pupil region 501 and spreads as the blurred image Γ1 in a defocus state to be received by the subpixels 201 in each pixel 200R, 200G, 200B of the image pickup element 107. A first parallax image is generated based on light receiving signals of the subpixels 201. In the first parallax image, the image p1 of the main object q1 and the blurred image Γ1 of the object q2 in front of the main object q1 are captured without overlapping with each other. This is an example of the parallax image in which the object at a close range side (blurred image Γ1 of the object q2) is captured in a narrowest range in a predetermined region (near the image p1 of the main object q1) among the plurality of parallax images (first and second parallax images). Furthermore, it is an example of the parallax image in which the blurred image Γ1 of the object q2 is minor and a contrast evaluation value is largest among the plurality of parallax images (first and second parallax images).

On the other hand, in FIG. 8C, the light beam from the main object q1 passes through the partial pupil region 502 and is imaged as the image p1 in the in-focus state, and the light beam from the object q2 in front of the main object q1 passes through the partial pupil region 502 and spreads as the blurred image Γ2 in a defocus state to be received by the subpixels 202 in each pixel 200R, 200G, 200B of the image pickup element 107. A second parallax image is generated based on light receiving signals of the subpixels 202. In the second parallax image, the image p1 of the main object q1 and the blurred image Γ2 of the object q2 in front of the main object q1 are captured while overlapping with each other. This is an example of the parallax image in which the object at the close range side (blurred image Γ2 of the object q2) is captured in a widest range in the predetermined region (near the image p1 of the main object q1) among the plurality of parallax images (first and second parallax images). Furthermore, it is an example of the parallax image in which the blurred image Γ2 of the object q2 is major and the contrast evaluation value is smallest among the plurality of parallax images (first and second parallax images).

In this embodiment, in the predetermined region (near the image p1), the first weight coefficient $W_a$ of the first parallax image in which the overlap of the image p1 and the blurred image Γ1 is small is set to be larger than the second weight coefficient $W_b$ of the second parallax image in which the overlap of the image p1 and the blurred image Γ2 is large, and the output image is generated according to expression (3). Accordingly, an image in which the blur covering of the main object q1 is reduced can be generated.

Preferably, in this embodiment, in a predetermined region of the output image, a weight coefficient for a parallax image in which an object at a close range side is captured in a widest range is smallest among the plurality of parallax images, or a weight coefficient for a parallax image in which the object at the close range side is captured in a narrowest range is largest. Preferably, in this embodiment, in the predetermined region of the output image, a weight coefficient for a parallax image having a smallest contrast evaluation value is smallest or a weight coefficient for a parallax image having a largest contrast evaluation value is largest among the plurality of parallax images.

Figure 9A:
FIG. 9A is an explanatory diagram of an effect of the image processing (blur adjustment processing) in each embodiment.
Figure 9B:
FIG. 9B is an explanatory diagram of the effect of the image processing (blur adjustment processing) in each embodiment.

Next, referring to FIGS. 9A and 9B, an effect of the image processing (blur adjustment processing) in this embodiment will be described. FIGS. 9A and 9B are explanatory diagrams of the effect of the image processing (blur adjustment processing). FIG. 9A illustrates an image before the blur adjustment processing that reduces the blur covering of the main object (bird) by the petals is performed in the region 700 of FIG. 7. FIG. 9B illustrates an image after the blur adjustment processing is performed. In the image of FIG. 9A (image on which the blur adjustment processing is not performed), a beak, an eye, and a wing of the bird are converted to be white by the blur of the petals (inside a circle indicated by a dashed line in FIG. 9A). On the other hand, in the image of FIG. 9B (image in which the blur adjustment processing has been performed), the blur covering is reduced. In this embodiment, if necessary, it is preferred that the weight coefficients (first and second weight coefficients) for the respective parallax images are added to be roughly equivalent to each other to generate the output image so as to avoid a change of a blur shape of the imaging optical system in a region other than the predetermined region (i.e., in a region where the blur adjustment processing is not to be performed).

Figures 10A, 10B, 10C:
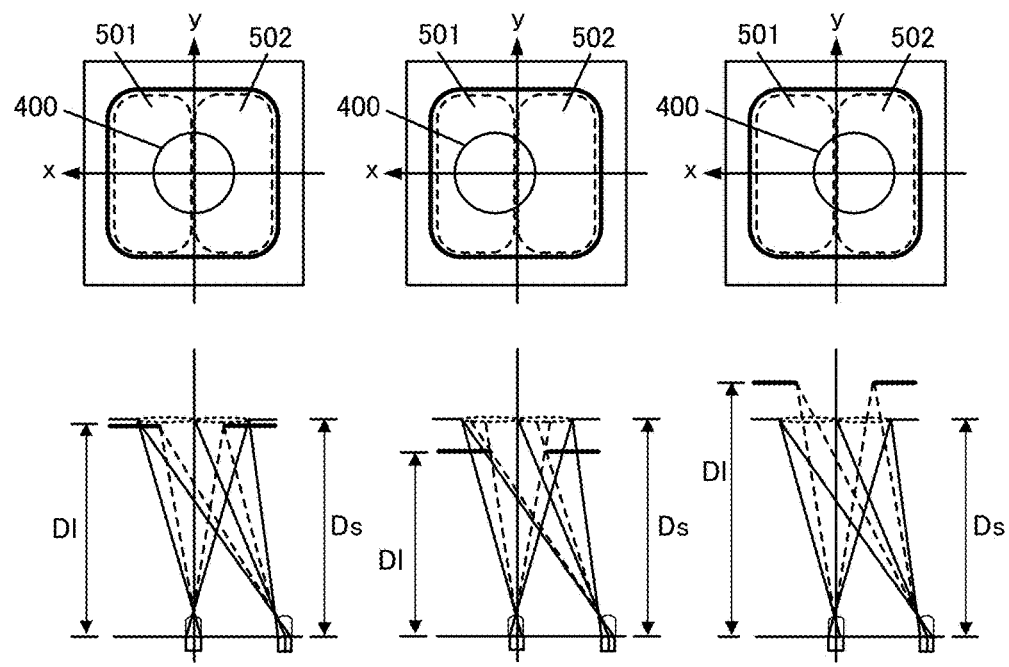
FIG. 10A is an explanatory diagram of an effective aperture value caused by a pupil shift in each embodiment.
FIG. 10B is an explanatory diagram of the effective aperture value caused by the pupil shift in each embodiment.
FIG. 10C is an explanatory diagram of the effective aperture value caused by the pupil shift in each embodiment.

Next, referring to FIGS. 10A to 10C, the pupil shift at a peripheral image height of the image pickup element 107 in this embodiment will be described. FIGS. 10A to 10C are explanatory diagrams of the effective aperture value caused by the pupil shift, and they illustrate a relation of the partial pupil regions 501 and 502 through which the lights, received by the subpixels 201 and 202, respectively, in each pixel arrayed at the peripheral image height of the image pickup element 107, pass, and the exit pupil 400 of the imaging optical system.

FIG. 10A illustrates a case in which an exit pupil distance Dl of the imaging optical system (distance between the exit pupil 400 and the imaging plane of the image pickup element 107) is approximately equal to a set pupil distance Ds of the image pickup element 107. In this case, the exit pupil 400 of the imaging optical system is approximately equally divided by the partial pupil regions 501 and 502 at the peripheral image height, similarly to a center image height.

On the other hand, as illustrated in FIG. 10B, when the exit pupil distance Dl of the imaging optical system is shorter than the set pupil distance Ds of the image pickup element 107, a pupil shift is generated between the exit pupil 400 of the imaging optical system and an entrance pupil of the image pickup element 107 at the peripheral image height of the image pickup element 107. Therefore, the exit pupil 400 of the imaging optical system is unequally divided. In the case of FIG. 10B, an effective aperture value of the first parallax image corresponding to the partial pupil region 501 is smaller (brighter) than that of the second parallax image corresponding to the partial pupil region 502. On the other hand, at the image height on the opposite side, the effective aperture value of the first parallax image corresponding to the partial pupil region 501 is larger (darker) than that of the second parallax image corresponding to the partial pupil region 502.

As illustrated in FIG. 10C, when the exit pupil distance Dl of the imaging optical system is longer than the set pupil distance Ds of the image pickup element 107, the pupil shift is generated between the exit pupil 400 of the imaging optical system and the entrance pupil of the image pickup element 107 at the peripheral image height of the image pickup element 107. Therefore, the exit pupil 400 of the imaging optical system is unequally divided. In the case of FIG. 10C, the effective aperture value of the first parallax image corresponding to the partial pupil region 501 is larger (darker) than that of the second parallax image corresponding to the partial pupil region 502. On the other hand, at the image height on the opposite side, the effective aperture value of the first parallax image corresponding to the partial pupil region 501 is smaller (brighter) than that of the second parallax image corresponding to the partial pupil region 502. As the pupil is divided non-uniformly due to the pupil shift at the peripheral image height, the effective aperture value (effective F number) of each of the first and second parallax images becomes non-uniform. Accordingly, a blur in one of the first and second parallax images spreads widely, and a blur in the other one of the first and second parallax images spreads narrowly. In this embodiment, therefore, if necessary, it is preferred that a weight coefficient of a parallax image of the plurality of parallax images that has a smallest effective aperture value is minimized or a weight coefficient of a parallax image that has a greatest effective aperture value is maximized in a predetermined region in an output image.

In the configuration described above, a blur covering of a main object is reduced after an image is captured, so that a quality of a captured image can be improved.

Embodiment 2

Next, referring to FIG. 11 and FIGS. 12A and 12B, an image pickup apparatus in Embodiment 2 of the present invention will be described. This embodiment is different from Embodiment 1 in that a captured image is generated based on first to fourth parallax images as a plurality of parallax images, instead of generating the captured image based on the first and second parallax images.

Figure 11:
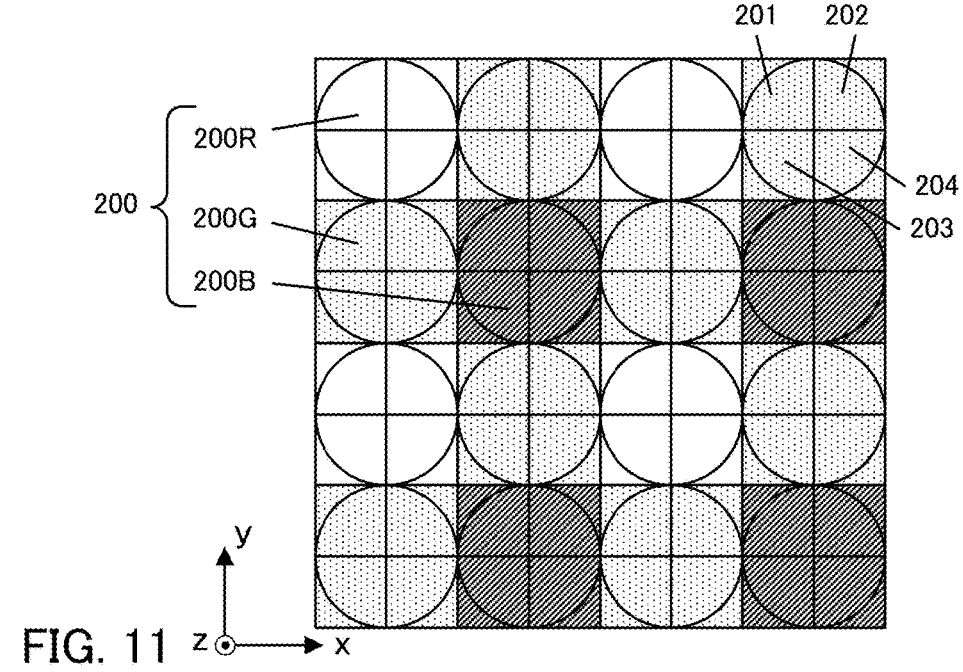
FIG. 11 is a diagram of illustrating a pixel array in Embodiment 2.
Figure 12A:
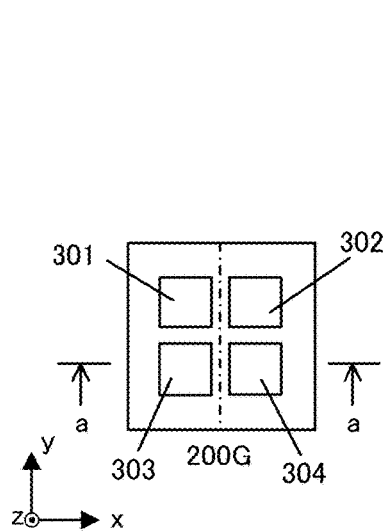
FIG. 12A is a diagram of illustrating a pixel structure in Embodiment 2.

FIG. 11 is a diagram illustrating the pixel array of the image pickup element 107 in this embodiment. FIGS. 12A and 12B are diagrams illustrating the pixel structure of the image pickup element 107, and FIGS. 12A and 12B illustrate a plan view of a pixel 200G of the image pickup element 107 (viewed in a +z direction) and a cross-sectional view along a line a-a in FIG. 12A (viewed in a −z direction), respectively.

FIG. 11 illustrates the pixel array (array of imaging pixels) of the image pickup element 107 (two-dimensional CMOS sensor) in a range of 4 columns×4 rows. In this embodiment, each of the imaging pixels (pixels 200R, 200G, and 200B) includes four subpixels 201, 202, 203, and 204. Therefore, FIG. 11 illustrates the array of the subpixels 201, 202, 203, and 204 in a range of 8 columns×8 rows.

As illustrated in FIG. 11, a pixel group 200 of 2 columns×2 rows includes the pixels 200R, 200G, and 200B in a Bayer array. In other words, in the pixel group 200, the pixel 200R having a spectral sensitivity for R (red) is disposed at the upper left, the pixels 200G having a spectral sensitivity for G (green) are disposed at the upper right and at the lower left, and the pixel 200B having a spectral sensitivity for B (blue) is disposed at the lower right. Each of the pixels 200R, 200G, and 200B (each imaging pixel) includes the subpixels 201, 202, 203, and 204 arrayed in 2 columns×2 rows. The subpixel 201 is a pixel that receives a light beam passing through a first pupil region of the imaging optical system. The subpixel 202 is a pixel that receives a light beam passing through a second pupil region of the imaging optical system. The subpixel 203 is a pixel that receives a light beam passing through a third pupil region of the imaging optical system. The subpixel 204 is a pixel that receives a light beam passing through a fourth pupil region of the imaging optical system.

As illustrated in FIG. 11, the image pickup element 107 includes a number of imaging pixels of 4 columns×4 rows (subpixels of 8 columns×8 rows) arranged on a surface, and it outputs an imaging signal (subpixel signal). In the image pickup element 107 of this embodiment, a period P of the pixels (imaging pixels) is 4 µm, and the number N of the pixels (imaging pixels) is horizontally 5575 columns×vertically 3725 rows=approximately 20.75 million pixels. In the image pickup element 107, a period $P_{SUB}$ of the subpixels in a column direction is 2 µm, and the number $N_{SUB}$ of the subpixels is horizontally 11150 columns×vertically 7450 rows=approximately 83 million pixels.

Figure 12B:
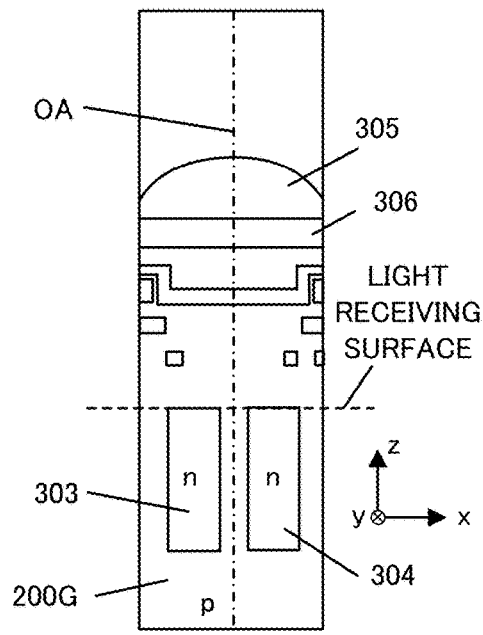
FIG. 12B is a diagram of illustrating the pixel structure in Embodiment 2.

As illustrated in FIG. 12B, the pixel 200G of this embodiment is provided with a microlens 305 at a light receiving surface side of the pixel 200G to condense incident light. Each of the microlenses 305 is disposed at a position away from the light receiving surface by a predetermined distance in a z-axis direction (direction of an optical axis direction). In the pixel 200G, photoelectric converters 301, 302, 303, and 304 are formed by dividing the pixel 200G into $N_H$ (two divisions) in an x direction and into $N_V$ (two divisions) in a y-axis direction. The photoelectric converters 301 to 304 correspond to the subpixels 201 to 204, respectively.

In this embodiment, the image pickup element 107 includes the plurality of subpixels 201, 202, 203, and 204 that share a single microlens 305 and that receive a plurality of light beams passing through regions (first to fourth partial pupil regions) different from each other in a pupil of the imaging optical system (imaging lens). The image pickup element 107 includes, as the plurality of subpixels, first subpixels (a plurality of subpixels 201), second subpixels (a plurality of subpixels 202), third subpixels (a plurality of subpixels 203), and fourth subpixels (a plurality of subpixels 204). In this embodiment, a first parallax image is generated by collecting the light receiving signals of the plurality of subpixels 201. Similarly, second to fourth parallax images are generated by collecting the light receiving signals of the plurality of subpixels 202, 203, and 204, respectively. In this embodiment, each of the first to fourth parallax images is an image in the Bayer array. If necessary, demosaicing processing may be performed on each of the first to fourth parallax images.

In this embodiment, each of symbols j and i is an integer, a j-th position in a row direction and a i-th position in a column direction in each of the first to fourth parallax images is represented as (j,i), and a first parallax image, a second parallax image, a third parallax image, and a fourth parallax image at the position (j,i) are represented as A(j,i), B(j,i), C(j,i), and D(j,i), respectively. A first weight coefficient of the first parallax image, a second weight coefficient of the second parallax image, a third weight coefficient of the third parallax image, and a fourth weight coefficient of the fourth parallax image are represented as $W_a(j,i)$, $W_b(j,i)$, $W_c(j,i)$, and $W_d(j,i)$, respectively.

As a first step, the CPU 121 (image processing circuit 125) sets a predetermined region R=[j1,j2]×[i1,i2] for reducing the blur covering of the main object, and a boundary width σ of the predetermined region R. Then, the CPU 121 calculates a table function T(j,i) depending on the predetermined region R and the boundary width σ of the predetermined region R according to expression (1).

The table function T(j,i) indicates 1 inside the predetermined range R and indicates 0 outside the predetermined range R, and roughly changes continuously from 1 to 0 in the boundary width σ of the predetermined region R. If necessary, the predetermined region R may be a circular shape or another arbitrary shape. Furthermore, if necessary, a plurality of predetermined regions R and boundary widths σ may be set.

As a second step, the CPU 121 (image processing circuit 125) calculates the first weight coefficient $W_a(j,i)$ of the first parallax image A(j,i) by using real coefficients $w_a$, $w_b$, $w_c$, and $w_d$ ($w_a+w_b+w_c+w_d=0$) according to expression (5A) below. Similarly, the CPU 121 (image processing circuit 125) calculates the second weight coefficient $W_b(j,i)$ of the second parallax image B(j,i), the third weight coefficient $W_c(j,i)$ of the third parallax image C(j,i), and the fourth weight coefficient $W_d(j,i)$ of the fourth parallax image D(j,i) according to expressions (5B) to (5D) below.

Math. 5A $$W_a(j,i)=1+w_a T(j,i) \tag{5A}$$

Math. 5B $$W_b(j,i)=1+w_b T(j,i) \tag{5B}$$

Math. 5C $$W_c(j,i)=1+w_c T(j,i) \tag{5C}$$

Math. 5D $$W_d(j,i)=1+w_d T(j,i) \tag{5D}$$

As a third step, the image processing circuit 125 generates an output image I(j,i) by expression (6) below.

Math. 6

$$I(j,i)=W_a(j,i)*A(j,i)+W_b(j,i)*B(j,i)+W_c(j,i)*C(j,i)+W_d(j,i)*D(j,i) \tag{6}$$

If necessary, the image processing circuit 125 may combine the refocus processing by the shift amounts s and t to generate an output image $I_{st}(j,i)$ according to expressions (7A) and (7B) below.

Math. 7A $$I_{st}(j, i) = W_a(j, i) * A(j, i) + W_b(j, i) * B(j, i+s) + \\ W_c(j, i) * C(j+t, i) + W_d(j, i+s) * D(j+t, i+s)$$  (7A)

Math. 7B $$I_{st}(j, i) = W_a(j, i) * A(j, i) + W_b(j, i+s) * B(j, i+s) + \\ W_c(j+t, i) * C(j+t, i) + W_d(j+t, i+s) * D(j+t, i+s)$$  (7B)

In this embodiment, other configurations are the same as those in Embodiment 1, and, accordingly, descriptions thereof are omitted. By the configuration described above, the blur covering on the main object after capturing an image is reduced so that the quality of the captured image can be improved.

As described above, in each embodiment, an image processing apparatus (image processing circuit 125) includes a determiner 125a and an image generator 125b. The determiner 125a determines a weight coefficient that varies depending on a position in each of a plurality of parallax images. The image generator 125b synthesizes (combines) the plurality of parallax images based on the weight coefficient to generate an image (synthesized image, combined image, or composite image). The image processing apparatus may include an acquirer that is capable of acquiring the weight coefficient determined by an apparatus, such as a CPU 121 (apparatus having a function similar to that of the determiner 125a), instead of the determiner 125a.

Preferably, the image generator 125b multiplies each of the plurality of parallax images by the weight coefficient and adds (synthesizes or combines) the weighted parallax images to generate the image. Preferably, the image generator 125b multiplies each of the plurality of parallax images by the weight coefficient, and shifts and adds (synthesizes or combines the images by using refocus processing on) the weighted parallax images to generate the image.

Preferably, the weight coefficient varies continuously depending on the position in each of the plurality of parallax images. For example, this can be achieved by using the table function T(j,i). Preferably, a sum (sum total) of the weight coefficients of the plurality of parallax images is constant with respect to all positions in the plurality of parallax images. For example, the sum of a first weight coefficient $W_a$ of a first parallax image and a second weight coefficient $W_b$ of a second parallax image that are obtained by an image pickup element including two subpixels for a single microlens, as described in Embodiment 1, is constant at any position in an image. Alternatively, the sum (sum total) of first to fourth weight coefficients $W_a$ to $W_d$ of the first to fourth parallax images, respectively, that are obtained by an image pickup element, including four subpixels for a single microlens, is constant at any position in an image.

Preferably, the plurality of parallax images are acquired by an image pickup element including a plurality of pixels 200R, 200G, and 200B, each pixel including a plurality of photoelectric converters (subpixels) that receive light beams passing through partial pupil regions of an imaging optical system different from each other. In other words, the plurality of parallax images is generated based on light receiving signals of the subpixels for each partial pupil region.

Preferably, the image generator 125b synthesizes the plurality of parallax images based on the weight coefficient in a first region (for example, a predetermined region R and a boundary width σ) of the image. More preferably, the first region is a region set to reduce a blur of a second object (object q2) that is at a closer range side than a first object (object q1). Preferably, the image generator 125b multiplies the plurality of parallax images by the weight coefficients equal to each other and adds the weighted parallax images in a second region (for example, outside the predetermined region R) different from the first region of the image to generate the image.

Preferably, the determiner 125a sets, in the first region of the image, the weight coefficient for a parallax image in which the second object that is at a closer range side than the first object is captured in a widest range to be minimized in the plurality of weight coefficients for the plurality of parallax images. Preferably, the determiner 125a sets, in the first region of the image, the weight coefficient for a parallax image in which the second object that is at a closer range side than the first object is captured in a narrowest range to be maximized in the plurality of weight coefficients for the plurality of parallax images.

Preferably, the determiner 125a sets, in the first region of the image, the weight coefficient for a parallax image that has a smallest contrast evaluation value to be minimized in the plurality of weight coefficients for the plurality of parallax images. Preferably, the determiner 125a sets, in the first region of the image, the weight coefficient for a parallax image that has a largest contrast evaluation value to be maximized in the plurality of weight coefficients for the plurality of parallax images.

Preferably, the determiner 125a sets, in the first region of the image, the weight coefficient for a parallax image that has a smallest effective aperture value to be minimized in the plurality of weight coefficients for the plurality of parallax images. Preferably, the determiner 125a sets, in the first region of the image, the weight coefficient for a parallax image that has a largest effective aperture value to be maximized in the plurality of weight coefficients for the plurality of parallax images.

Other Embodiments

Embodiments of the present invention can also be realized by a computer of a system or an apparatus that reads out and executes computer executable instructions (e.g., one or more programs) recorded on a storage medium (that may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or the apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., a central processing unit (CPU), a micro processing unit (MPU)), and may include a network of separate computers or separate processors to read out and to execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), a digital versatile disc (DVD), or a Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An image processing apparatus comprising:
   at least one processor operatively coupled to a memory, and serving as:
   (a) a determiner configured to determine a weight coefficient that varies depending on a position in each of a plurality of parallax images; and
   (b) an image generator configured to synthesize the plurality of parallax images based on the weight coefficient to generate an image,
   wherein a sum of the weight coefficients of the plurality of parallax images is constant with respect to all positions in the plurality of parallax images.

2. The image processing apparatus according to claim 1, wherein the image generator is configured to multiply each of the plurality of parallax images by the weight coefficient to create weighted parallax images, and to add the weighted parallax images to generate the image.

3. The image processing apparatus according to claim 1, wherein the image generator is configured to multiply each of the plurality of parallax images by the weight coefficient to create weighted parallax images, and to shift and to add the weighted parallax images to generate the image.

4. The image processing apparatus according to claim 1, wherein the weight coefficient varies continuously depending on the position in each of the plurality of parallax images.

5. The image processing apparatus according to claim 1, wherein the plurality of parallax images are acquired by an image pickup element including a plurality of pixels, each pixel including a plurality of photoelectric converters configured to receive light beams passing through partial pupil regions of an imaging optical system that are different from each other.

6. The image processing apparatus according to claim 1, wherein the image generator is configured to synthesize the plurality of parallax images based on the weight coefficient in a first region of the image.

7. The image processing apparatus according to claim 6, wherein the first region is a region set to reduce a blur of a second object that is at a closer range side than a first object.

8. The image processing apparatus according to claim 6, wherein the image generator is configured to multiply the plurality of parallax images by the weight coefficients that are equal to each other to create weighted parallax images, and to add the weighted parallax images in a second region different from the first region of the image to generate the image.

9. The image processing apparatus according to claim 6, wherein the determiner is configured to set, in the first region of the image, the weight coefficient for a parallax image in which a second object that is at a closer range side than a first object is captured in a widest range to be minimized in a plurality of weight coefficients for the plurality of parallax images.

10. The image processing apparatus according to claim 6, wherein the determiner is configured to set, in the first region of the image, the weight coefficient for a parallax image in which a second object that is at a closer range side than a first object is captured in a narrowest range to be maximized in a plurality of weight coefficients for the plurality of parallax images.

11. The image processing apparatus according to claim 6, wherein the determiner is configured to set, in the first region of the image, the weight coefficient for a parallax image that has a smallest contrast evaluation value to be minimized in a plurality of weight coefficients for the plurality of parallax images.

12. The image processing apparatus according to claim 6, wherein the determiner is configured to set, in the first region of the image, the weight coefficient for a parallax image that has a largest contrast evaluation value to be maximized in a plurality of weight coefficients for the plurality of parallax images.

13. The image processing apparatus according to claim 6, wherein the determiner is configured to set, in the first region of the image, the weight coefficient for a parallax image that has a smallest effective aperture value to be minimized in a plurality of weight coefficients for the plurality of parallax images.

14. The image processing apparatus according to claim 6, wherein the determiner is configured to set, in the first region of the image, the weight coefficient for a parallax image that has a largest effective aperture value to be maximized in a plurality of weight coefficients for the plurality of parallax images.

15. An image pickup apparatus comprising:
   (A) an image pickup element including a plurality of pixels, each pixel including a plurality of photoelectric converters configured to receive light beams passing through partial pupil regions of an imaging optical system that are different from each other; and
   (B) at least one processor operatively coupled to a memory, and serving as:
   (a) a determiner configured to determine a weight coefficient that varies depending on a position in each of a plurality of parallax images obtained from the plurality of photoelectric converters; and
   (b) an image generator configured to synthesize the plurality of parallax images based on the weight coefficient to generate an image,
   wherein a sum of the weight coefficients of the plurality of parallax images is constant with respect to all positions in the plurality of parallax images.

16. The image pickup apparatus according to claim 15, wherein the image pickup element includes the plurality of photoelectric converters for each of microlenses, and the microlenses are arrayed in two dimensions.

17. An image processing method comprising:
   determining a weight coefficient that varies depending on a position in each of a plurality of parallax images; and
   synthesizing the plurality of parallax images based on the weight coefficient to generate an image,
   wherein a sum of the weight coefficients of the plurality of parallax images is constant with respect to all positions in the plurality of parallax images.

18. A non-transitory computer-readable storage medium storing a program that causes a computer to execute a process comprising:
   determining a weight coefficient that varies depending on a position in each of a plurality of parallax images; and synthesizing the plurality of parallax images based on the weight coefficient to generate an image,
wherein a sum of the weight coefficients of the plurality of parallax images is constant with respect to all positions in the plurality of parallax images.

* * * * *